(12) United States Patent
Takahashi

(10) Patent No.: US 8,399,351 B2
(45) Date of Patent: Mar. 19, 2013

(54) METHOD OF MANUFACTURING A SEMICONDUCTOR DEVICE

(75) Inventor: Masashi Takahashi, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 278 days.

(21) Appl. No.: 12/659,600

(22) Filed: Mar. 15, 2010

(65) Prior Publication Data

US 2010/0240212 A1 Sep. 23, 2010

(30) Foreign Application Priority Data

Mar. 19, 2009 (JP) ................................. 2009-069065

(51) Int. Cl.
*H01L 21/4763* (2006.01)
(52) U.S. Cl. ................ 438/637; 257/E21.585; 257/774
(58) Field of Classification Search .................. 438/637; 257/E21.585, 621, 774
See application file for complete search history.

(56) References Cited

U.S. PATENT DOCUMENTS 6,287,964 B1 * 9/2001 Cho .............................. 438/643
2009/0246373 A1 * 10/2009 Tachibana et al. ........ 427/255.23

FOREIGN PATENT DOCUMENTS

| JP | 10-209280 | * | 8/1998 |
| JP | H10-209280 A | | 8/1998 |

* cited by examiner

*Primary Examiner* — Tony Tran
(74) *Attorney, Agent, or Firm* — Rabin & Berdo, P.C.

(57) ABSTRACT

A semiconductor device manufacturing method includes a process for filling holes in a dielectric film with tungsten. The process deposits tungsten in the holes, partially etches the deposited tungsten, and then deposits additional tungsten in the holes. Voids that may be left by the first tungsten deposition step are made accessible by openings formed in the etching step, and are then filled in by the second tungsten deposition step. Tungsten hexafluoride may be used as both a deposition source gas and an etching gas, providing a simple and inexpensive process that is suitable for high-volume production.

4 Claims, 5 Drawing Sheets

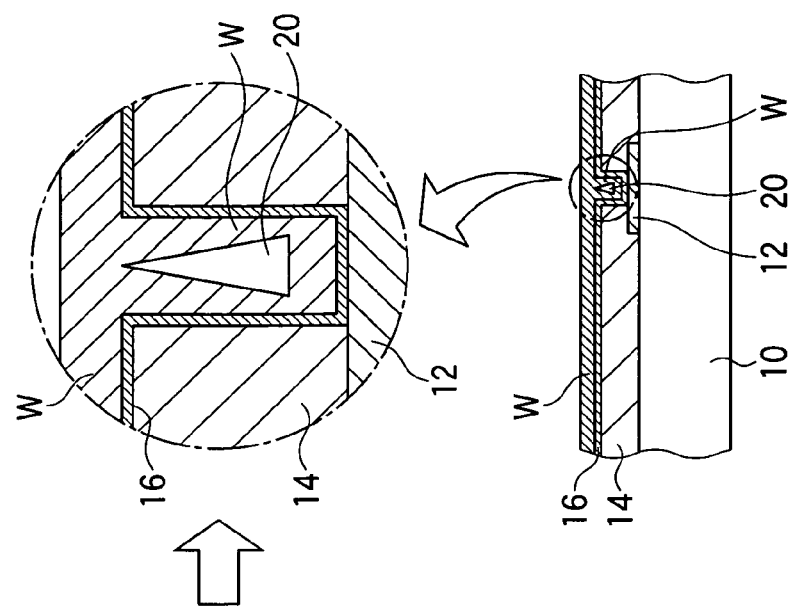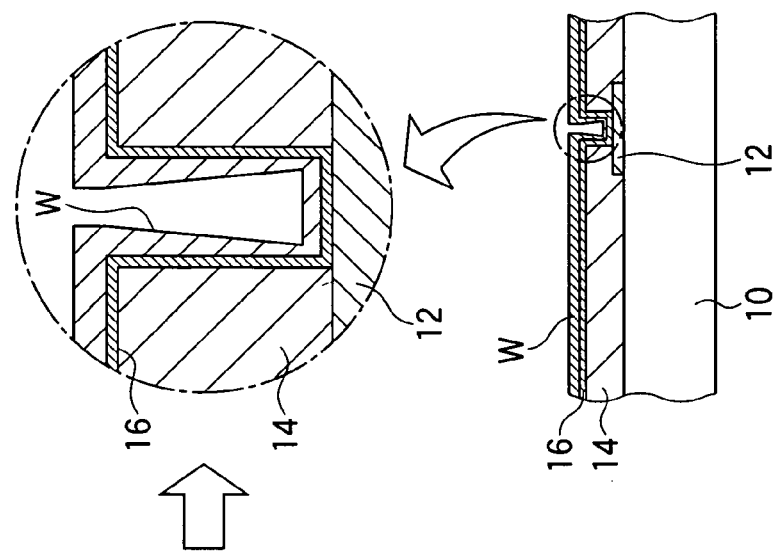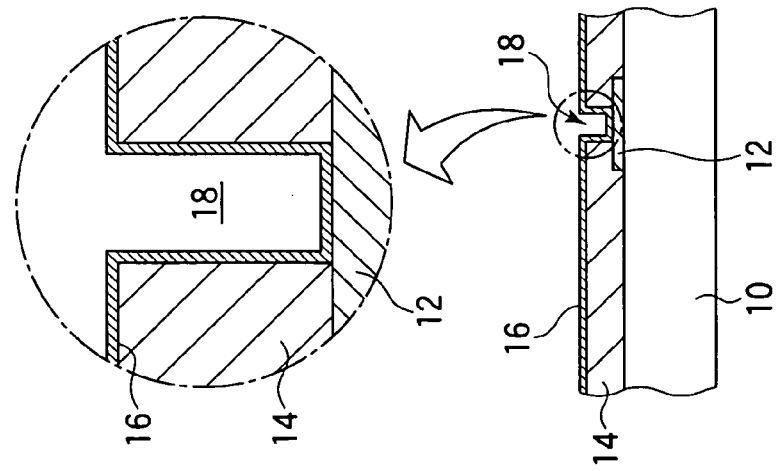

METHOD OF MANUFACTURING A SEMICONDUCTOR DEVICE

BACKGROUND OF THE INVENTION

1. Field of the Invention

The present invention relates to a method of manufacturing a semiconductor device, more particularly to a method of depositing tungsten in holes in a semiconductor device.

2. Description of the Related Art

Tungsten (W) is a conductive metal that is commonly used to fill the contact holes or via holes that pass through dielectric films to interconnect wiring traces in different wiring layers in semiconductor devices.

The known methods of depositing tungsten include chemical vapor deposition (CVD), sputtering, and atomic layer epitaxy (ALE). The most widely used method is tungsten CVD, a description of which is given by Miyata in Japanese Patent Application Publication No. H10-209280. This method employs, for example, the reaction between tungsten hexafluoride gas ($WF_6$) and hydrogen gas ($H_2$) given by the following formula:

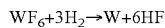

$$WF_6 + 3H_2 \rightarrow W + 6HF$$

When this reaction is used to deposit tungsten in a hole under conditions such that the deposition rate is equal to the supply rate (such conditions occur in region A in the graph in FIG. 1), the reaction tends to be completed near the surface of the dielectric film. The tungsten atoms therefore have a high probability of being deposited on the surface of the dielectric layer or the top inner rim of the hole, and a low probability of penetrating into the deeper parts of the hole. The result can be that insufficient tungsten reaches the interior of the hole and a void is left, as seen in FIG. 2, which shows the dielectric film 14, an adhesion layer 16 of titanium nitride (TiN), the hole 18, and the void 20.

Under conditions such that the deposition rate is equal to the reaction rate (such conditions occur in region B in FIG. 1), $WF_6$ gas is supplied in sufficient quantity that tungsten is deposited at a uniform rate on both the surface of the dielectric film and the interior of the hole, as shown in FIG. 3. Under these conditions, the hole can be filled with tungsten without forming a void.

Tungsten CVD is therefore usually carried out under region B conditions, but $WF_6$ gas also has the unwanted effect of etching the deposited layer of tungsten, the substrate layer on which the tungsten is deposited, and the dielectric film in which the hole is formed. If more $WF_6$ gas is supplied than necessary, the tungsten layer W and the TiN adhesion layer 16 in FIG. 3 may be etched to such an extent that detachment occurs. In addition, $WF_6$ gas may diffuse through these layers and etch the dielectric film 14 or the layer below the dielectric film 14, creating voids there. The flow rate of the $WF_6$ gas must be controlled to prevent these effects.

Ideally, it should always be possible to fill holes with tungsten as in FIG. 3, without creating voids, by performing tungsten CVD under region B conditions, but as the dimensions of wiring traces and the diameter of via holes become increasingly small, or the holes become increasingly deep, there is an increasing tendency for voids to form as in FIG. 2 despite the use of region B conditions. The reason is thought to be a decreasing probability of $WF_6$ penetrating into the hole, especially to the bottom of the hole, so that in the interior of the hole, and especially at the bottom, tungsten is deposited under region A conditions, leading to a difference in the deposition rates at the top and bottom of the hole.

For tungsten CVD to proceed under region B conditions from the top to the bottom of the hole, it becomes necessary to increase the $WF_6$ flow rate, but this leads to unwanted etching and the other problems noted above.

A proposed method of avoiding these problems is to deposit tungsten by atomic layer epitaxy, which has excellent coverage properties, but this method also has an extremely slow deposition rate, and is unsuitable for high-volume manufacturing.

SUMMARY OF THE INVENTION

An object of the present invention is to provide a semiconductor device manufacturing method that is simple, inexpensive, and suitable for high-volume production, and can fill holes in dielectric films with tungsten without leaving voids.

The semiconductor device manufacturing method provided by the invention includes a novel process for filling a hole formed in a dielectric film in the semiconductor device with tungsten. The process begins by depositing tungsten in the hole. The tungsten deposited in the hole is then partially etched, after which additional tungsten is deposited in the hole.

In one embodiment, tungsten is deposited in the hole by supplying tungsten hexafluoride gas and hydrogen gas under chemical vapor deposition conditions that produce equal reaction and deposition rates. The supply of hydrogen gas is then halted while the supply of tungsten hexafluoride gas continues. The tungsten hexafluoride gas now acts as an etching gas, etching the upper part of the tungsten deposited in the hole. The supply of hydrogen gas is then resumed to deposit additional tungsten in the hole, again under the chemical vapor deposition conditions producing equal reaction and deposition rates.

Although the first deposition step may leave an enclosed void in the hole, as can occur if tungsten is deposited faster at the top than at the bottom of the hole, the etching step reopens the void, and the second deposition step then fills the void.

The novel process is simple and inexpensive, particularly if the tungsten hexafluoride deposition source gas is also used as an etching gas, and is suitable for high-volume production because the tungsten can be deposited by chemical vapor deposition instead of atomic layer epitaxy.

BRIEF DESCRIPTION OF THE DRAWINGS

In the attached drawings:

FIGS. 4 to 8 are sectional drawings illustrating steps in the fabrication of a semiconductor device according to a first embodiment of the invention, each drawing including a partially enlarged view of a contact hole.

DETAILED DESCRIPTION OF THE INVENTION

Figure 1:
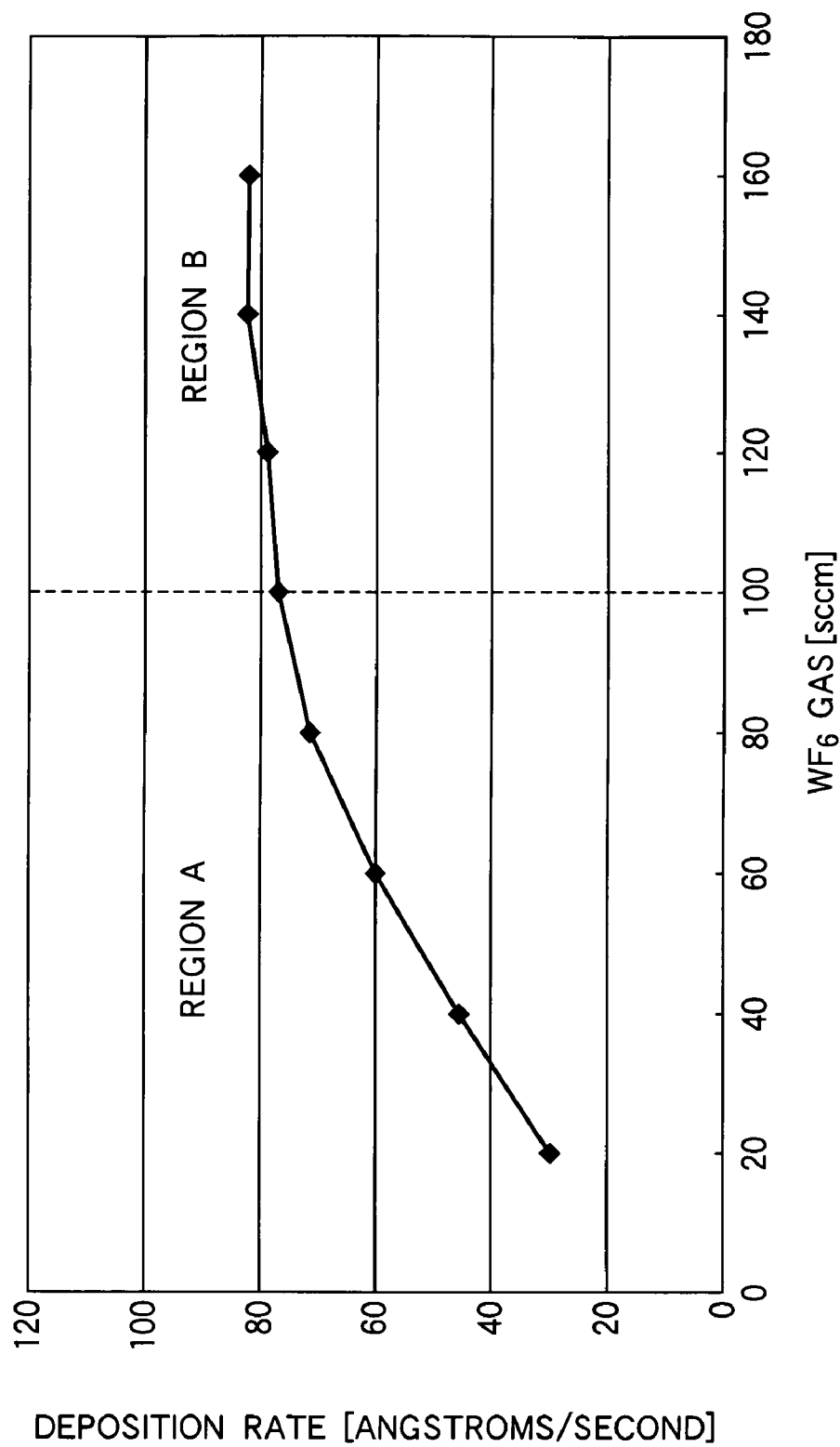
FIG. 1 is a graph of tungsten CVD conditions illustrating regions A and B.
Figure 3:
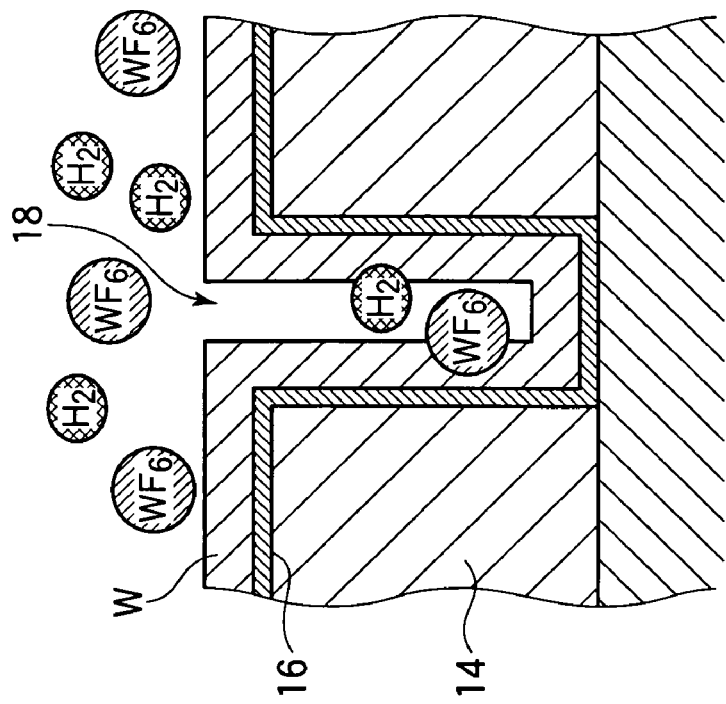
FIGS. 2 and 3 illustrate conventional tungsten CVD.
Figure 2:
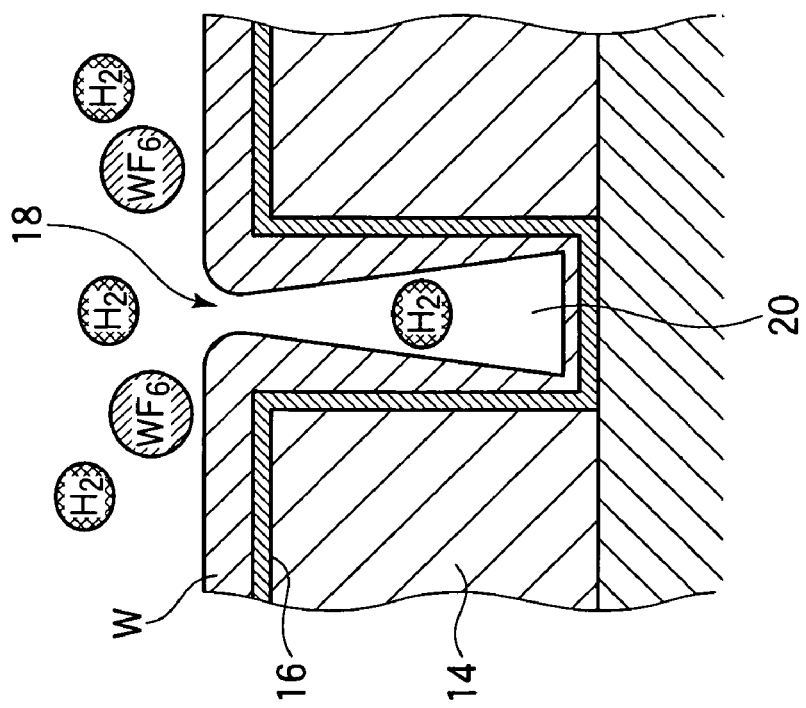

Embodiments of the invention will now be described with reference to the attached drawings, in which like elements are indicated by like reference characters.

First Embodiment

Referring to FIG. 4, the method of forming a semiconductor device according to the first embodiment begins from a semiconductor substrate 10 on which semiconductor circuit elements (not shown) and interconnection wiring 12, electrically coupled to the semiconductor circuit elements, are formed. A dielectric film 14 such as a layer of silicon oxide or a layer of borophosphosilicate glass (BPSG) is then formed, covering the interconnection wiring 12, and is selectively etched by photolithography and reactive ion etching to form holes 18 extending from the surface of the dielectric film 14 down to the underlying wiring layer or circuit element. Next an adhesion layer such as a layer of titanium nitride (TiN) is formed on the surface of the dielectric film 14 and the inner side and bottom walls of each hole 18.

Although the illustrated hole 18 leads to interconnection wiring 12, the novel process may also be applied in other configurations: for example, the hole 18 may lead to the gate, source, or drain of a semiconductor circuit element formed on the semiconductor substrate 10.

Referring to FIG. 5, next the semiconductor substrate 10, including the dielectric film 14 in which the hole 18 has been formed, is placed in a deposition chamber in a depositing apparatus, and a first layer of tungsten (W) is deposited in the hole 18 formed in the dielectric film 14. This first deposition step is carried out by tungsten CVD. Tungsten hexafluoride gas ($WF_6$) is supplied together with hydrogen gas ($H_2$), under conditions that produce equal reaction and deposition rates (region B). Exemplary conditions producing equal deposition and reaction rates are a deposition temperature of 460 degrees Celsius, a chamber pressure of 10,000 pascals, and gas flow rates of 120 standard cubic centimeters per minute (sccm) for $WF_6$, 750 sccm for $H_2$, 100 sccm for nitrogen ($N_2$), and 1900 sccm for argon (Ar).

When this first deposition step is carried out, if the hole 18 has a small diameter or a deep depth, the $WF_6$ gas has a reduced probability of reaching the inside (especially the bottom) of the hole 18, resulting in different deposition rates at the top and the bottom of the hole 18. More specifically, the deposition rate is higher at the top than at the bottom.

Consequently, as shown in FIG. 6, tungsten (W) is deposited faster at the top than at the bottom of the hole 18, plugging the top of the hole before the inside of the hole 18 is completely filled with tungsten. When deposition stops, a void 20 is left in the hole 18.

This first deposition step also forms a layer of tungsten (W) on the surface of the dielectric film 14, as shown.

It is known that in tungsten CVD, if the flow rate of the $WF_6$ source gas is varied, the deposition rate also varies, as shown in FIG. 1. Region A in FIG. 1, in which the deposition rate rises together with the $WF_6$ gas flow rate, produces equal deposition and supply rates. Region B, in which the deposition rate is substantially constant regardless of the rise in the $WF_6$ flow rate, produces equal deposition and reaction rates. More precisely, in region A the deposition rate is governed by the supply rates of the $WF_6$ gas and $H_2$ gas, while in region B the deposition rate is governed by the $WF_6+H_2$ reaction rate on the surface where deposition takes place.

It will be assumed below that a $WF_6$ gas flow rate (supply rate) less than 100 sccm produces equal deposition and supply rates, and a $WF_6$ gas flow rate of 100 sccm or more produces equal deposition and reaction rates.

Figure 7:
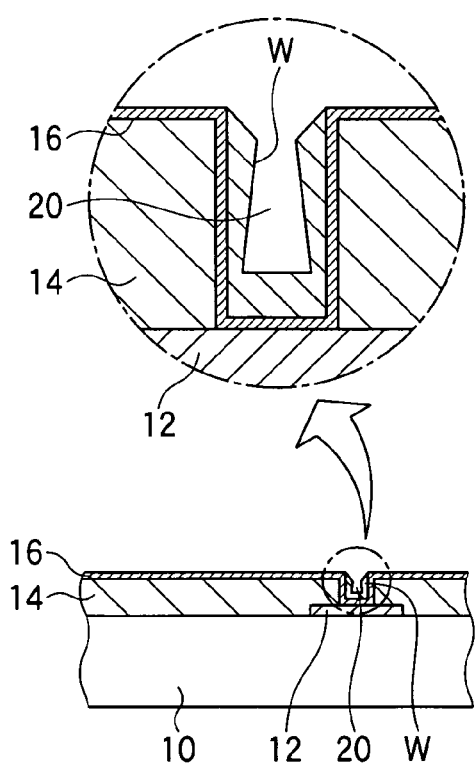

Referring to FIG. 7, next the tungsten (W) deposited in the hole 18 is partly etched.

In this etching step, etching is carried out in situ by halting the flow of hydrogen gas that was supplied during the first deposition step, reducing the supply of $WF_6$ gas to less than 100 sccm (region A), and using $WF_6$ gas as an etching gas, without moving the semiconductor substrate 10 from deposition chamber in which the first deposition step was carried out. Exemplary conditions for this etching step are a temperature of 460 degrees Celsius, a chamber pressure of 10,000 pascals, and gas flow rates of 40 sccm for $WF_6$, 100 sccm for $N_2$, and 1900 sccm for Ar.

As shown in FIG. 7, this etching step removes substantially all of the tungsten from the surface of the dielectric film 14 and creates an opening leading to the void 20 in the hole, but leaves most of the tungsten inside the hole intact. The reason for this selective etching effect is that when the $WF_6$ gas flow rate is lower than 100 sccm (region A), even after the opening is created, the probability that $WF_6$ gas will enter the hole 18 is low enough that comparatively little etching takes place inside the hole 18, except near the top of the hole 18.

In an alternative etching strategy, $WF_6$ gas is first supplied at a rate of 100 sccm or more (region B) until the etching process begins to produce an opening at the top of the hole 18, and is then reduced to a rate less than 100 sccm (region A) while the opening is enlarged. Since etching proceeds in proportion to the supply of $WF_6$ gas, supplying the $WF_6$ gas at a rate in region B (which would produce equal deposition and reaction rates if hydrogen were also supplied) yields a faster etching rate than supplying $WF_6$ gas at a rate in region A, enabling the tungsten covering the dielectric film 14 and burying the hole 18 to be removed more quickly. Reducing the $WF_6$ gas flow rate to a rate in region A then enables the opening to be enlarged without removing too much tungsten from inside the hole 18. The switchover from the region B flow rate to the region A flow rate is preferably made just before the $WF_6$ begins to penetrate into the void 20.

Even after the $WF_6$ gas penetrates into the void 20, etching proceeds faster at the top of the hole 18 than in the lower part of the hole 18, because more $WF_6$ gas is available at the top of the hole 18 than in the lower part of the void 20. FIG. 7 shows a stage of the etching process at which a protruding lip of tungsten still remains at the top of the hole 18. From the state shown in FIG. 7, the etching process may proceed until the lip of tungsten is essentially removed and the void 20 is wide open at the top of the hole 18, but the etching process is halted well before all tungsten is removed from the hole 18.

Figure 8:
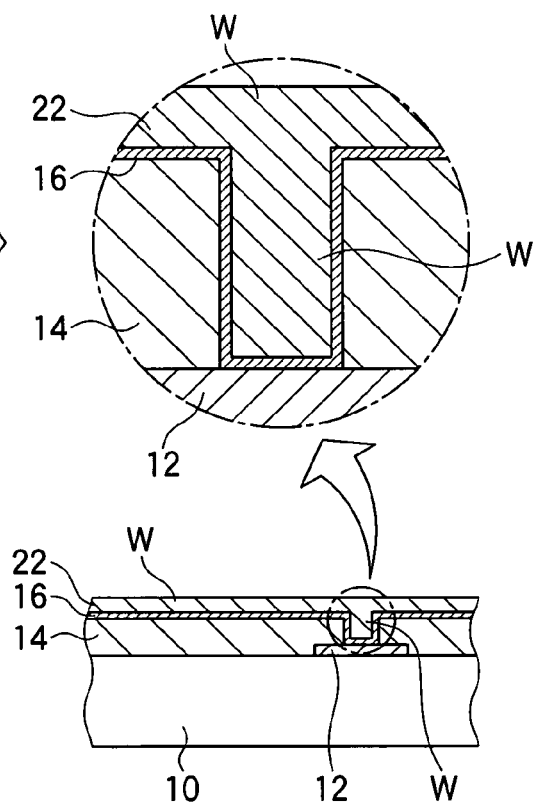

Referring to FIG. 8, a second deposition step is now carried out to deposit additional tungsten (W) in the hole 18. This second deposition step is also carried out in situ, by resuming the supply of hydrogen gas that was halted for the etching step and increasing the $WF_6$ gas flow rate to a level that produces equal deposition and reaction rates (region B), without moving the semiconductor substrate 10 into or out of the deposition chamber in which the first deposition step and the etching step were performed. The second deposition step may be carried out under the same conditions as the first deposition step, e.g., a deposition temperature of 460 degrees Celsius, a chamber pressure of 10,000 pascals, and gas flow rates 120 sccm for $WF_6$, 750 sccm for $H_2$, 100 sccm for $N_2$, and 1900 sccm for Ar.

During the second deposition step, $WF_6$ and $H_2$ gases enter the void 20 from the opening etched at the top, react inside the void 20, and deposit tungsten on the walls of the void 20. Since the lower part of the void 20 is already filled with tungsten left from the first deposition step, the second deposition step is able to fill the hole 18 completely without leaving another void.

Tungsten (W) is also deposited on the surface of the dielectric film 14 by the second deposition step. The layer of tungsten formed on the surface of the dielectric film 14 can be patterned by, for example, photolithography and reactive ion etching to create another layer of interconnection wiring 22. This procedure reduces the number of steps in the fabrication process.

To summarize the process described above, after the first deposition step has been carried out, the tungsten deposited in the hole is partly etched, especially at the top of the hole, and then a second deposition step is carried out to deposit more tungsten in the hole. Although the first deposition step may leave an enclosed void in the hole, the etching step reopens the void and the second deposition step fills it, so that the entire hole is filled with tungsten.

The method of manufacturing a semiconductor device in the first embodiment is therefore simple, inexpensive, and suitable for high-volume production, and can fill holes in a dielectric film with tungsten without leaving voids.

Second Embodiment

The second embodiment includes the steps already shown in FIGS. 4 to 8, which fill a hole 18 formed in a dielectric film 14 with tungsten and form a tungsten layer on the surface of the dielectric film 14, and two further steps, which will be described below.

Figure 9:
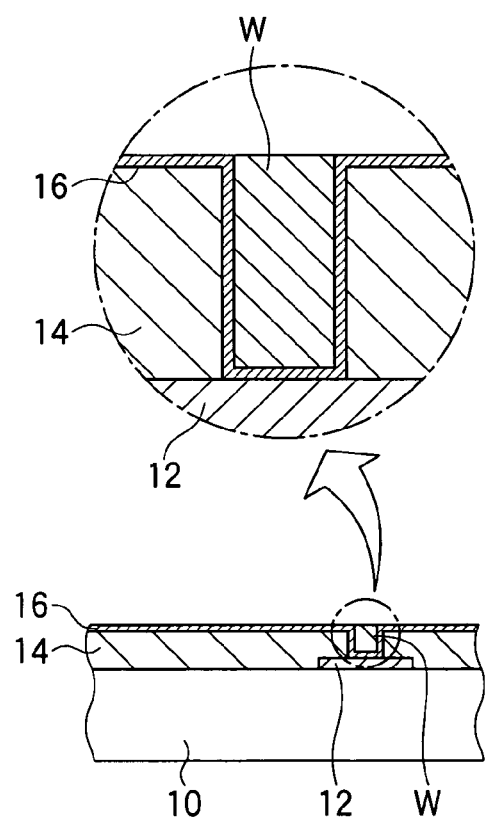
FIGS. 9 and 10 are sectional drawings illustrating steps carried out after the step in FIG. 7 in a second embodiment of the invention, each drawing including a partially enlarged view of the contact hole.

Referring to FIG. 9, the next step is a second etching step that etches the tungsten layer deposited on the surface of the dielectric film 14 in the second deposition step. This etching step removes substantially all of the tungsten from the surface of the dielectric film 14.

This second etching step is carried out in situ by halting the flow of hydrogen gas that was supplied during the second deposition step, reducing the $WF_6$ gas flow to less than 100 sccm (region A), and using $WF_6$ gas as an etching gas, without moving the semiconductor substrate 10 from the deposition chamber in which the first and second deposition steps were carried out. Exemplary conditions for this second etching step are a temperature of 460 degrees Celsius, a chamber pressure of 10,000 pascals, and gas flow rates of 40 sccm for $WF_6$, 100 sccm for $N_2$, and 1900 sccm for Ar.

Figure 10:
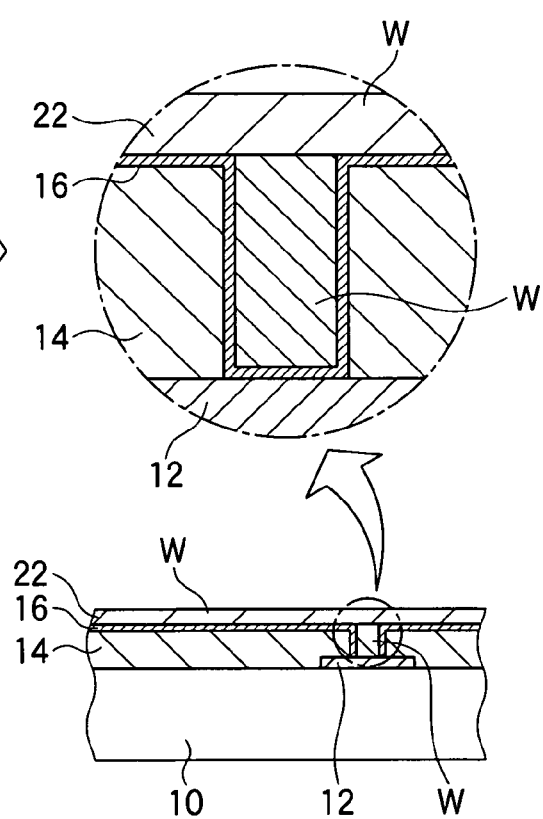

Referring to FIG. 10, a third deposition step is now carried out to deposit additional tungsten (W) on the surface of the dielectric film 14. This third deposition step is also carried out in situ, by resuming the supply of hydrogen gas that was halted for the second etching step and adjusting the supply of $WF_6$ gas to an appropriate level less than 100 sccm (region A), again without moving the semiconductor substrate 10 into or out of the depositing chamber in which the first and second deposition and etching steps were carried out. The third deposition differs from the first and second deposition steps in that it is carried out by tungsten CVD with tungsten hexafluoride ($WF_6$) and hydrogen ($H_2$) gas flow rates that that produce equal deposition and supply rates (region A). Exemplary CVD conditions for the third deposition step are a deposition temperature of 460 degrees Celsius, a chamber pressure of 10,000 pascals, and flow rates of 40 sccm for $WF_6$, 750 sccm for $H_2$, 100 sccm for $N_2$, and 1900 sccm for Ar.

The layer of tungsten (W) formed on the surface of the dielectric film 14 by the third deposition step is now patterned by, for example, photolithography and reactive ion etching to create another layer of interconnection wiring 22.

The third deposition step leaves the tungsten filling the hole 18 undisturbed and forms a surface layer of tungsten with high reflectance.

Tungsten deposited by CVD has a smaller grain size when deposited under conditions such that the deposition rate is equal to the supply rate (region A) than when deposited under conditions such that the deposition rate is equal to the reaction rate (region B). The smaller grain size reduces surface irregularities of the deposited layer. Besides producing higher reflectance, the resulting smoothness of the layer enables it to be patterned more accurately by photolithography, thereby reducing dimensional variations in the interconnection wiring 22 formed from the deposited tungsten layer. The smoothness also reduces shape irregularities in the side walls formed during the etching part of the patterning process. The result is to reduce interconnection wiring defects.

The manufacturing methods in the embodiments above do not compromise high-volume productivity, because the tungsten deposition rates are comparable to the rates in conventional manufacturing processes using tungsten CVD.

Although the embodiments above have been described as using chemical vapor deposition for both the first and second deposition steps, sputtering may be used for either of these deposition steps. The invention provides the same effects for sputtering as for CVD: voids left by the first deposition step are exposed by the etching step and then filled in by the second deposition step. Sputtering can also be used to obtain a manufacturing process that is simple, inexpensive, and suitable for high-volume production, and fills holes with tungsten without leaving voids.

When chemical vapor deposition is carried out in the first and second deposition steps, the invention preserves the advantage of using conditions such that the deposition rate and reaction rate is equal, which is that the reaction gases ($WF_6$ and $H_2$) penetrate into the hole 18 or void 20, especially into its bottom part, more easily than when deposition is carried out under conditions such that deposition rate and supply rate is equal. The invention also enables void-free filling of holes in comparatively few deposition steps.

In addition, because the second embodiment eliminates the need for an excessively high $WF_6$ gas flow rate, it avoids the problems of unwanted etching of the deposited tungsten layer and the substrate layer on which the tungsten layer is deposited (for example, the dielectric film 14 or the adhesion layer 16) and unwanted detachment of layers, as well as eliminating voids.

In both of the embodiments above, tungsten hexafluoride gas is used to etch deposited tungsten. The etching can therefore be carried out in an extremely simple way, just by halting the supply of hydrogen gas after the first or second deposition step.

The invention is not limited to the use of tungsten hexafluoride ($WF_6$) as an etching gas, however. Any etching gas capable of etching tungsten may be used.

The deposited tungsten need not be etched by use of an etching gas as in the embodiments above; reactive ion etching and other etching methods are also available.

However, etching by tungsten hexafluoride gas has the advantage that the etching process can be carried out in situ, in the same chamber as the tungsten deposition steps, just by halting the flow of hydrogen. This feature makes the embodiments described above particularly simple and suitable for inexpensive high-volume production.

If necessary, the second deposition step and the preceding etching step may be repeated one or more times to ensure that no void is left in the hole. That is, instead of eliminating the void in one etch-and-redeposit procedure, the novel process may gradually reduce the size of the void through multiple etch-and-redeposit procedures until the void is completely gone.

Those skilled in the art will recognize that further variations are possible within the scope of the invention, which is defined in the appended claims.

What is claimed is:

1. A method of manufacturing a semiconductor device, the method including a process for filling a hole formed in a dielectric film in the semiconductor device with tungsten, said process comprising:

initially depositing tungsten in the hole by supplying tungsten hexafluoride (WF6) gas and hydrogen gas under chemical vapor deposition conditions producing a reaction rate and a deposition rate such that the deposition rate is equal to the reaction rate, a void being disposed in the tungsten deposited in the hole;

halting the supply of hydrogen gas and continuing to supply tungsten hexafluoride gas to etch an upper part of the tungsten deposited in the hole, the etching creating an opening leading to the void in the deposited tungsten;

depositing additional tungsten in the hole by again supplying the tungsten hexafluoride gas and the hydrogen gas under the chemical vapor deposition conditions producing a reaction rate and a deposition rate such that the deposition rate is equal to the reaction rate, the additional tungsten substantially filling the void and the opening;

wherein in halting the supply of hydrogen gas and continuing to supply tungsten hexafluoride gas, a rate of the supply of tungsten hexafluoride gas is reduced to less than that when initially depositing tungsten in the hole by supplying tungsten hexafluoride gas and hydrogen gas;

wherein depositing additional tungsten in the hole also includes depositing the additional tungsten on the dielectric film, the method further comprising:

halting the supply of hydrogen gas and continuing to supply tungsten hexafluoride gas to etch the additional tungsten deposited on the dielectric film; and depositing further tungsten on the dielectric film by supplying the tungsten hexafluoride gas and the hydrogen gas under chemical vapor deposition conditions producing a supply rate and a deposition rate such that the deposition rate is equal to the supply rate.

2. The method of claim 1, wherein the chemical vapor deposition conditions producing a reaction rate and a deposition rate such that the deposition rate is equal to the reaction rate include a tungsten hexafluoride gas flow rate of at least one hundred standard cubic centimeters per minute.

3. The method of claim 1, wherein halting the supply of hydrogen gas and continuing to supply tungsten hexafluoride gas includes supplying tungsten fluoride gas at a flow rate less than one hundred standard cubic centimeters per minute.

4. The method of claim 1, wherein the chemical vapor deposition conditions producing a supply rate and a deposition rate such that the deposition rate is equal to the supply rate include a tungsten hexafluoride gas flow rate of less than one hundred standard cubic centimeters per minute.

* * * * *